United States Patent
Davenport et al.

(10) Patent No.: US 6,300,885 B1
(45) Date of Patent: Oct. 9, 2001

(54) DUAL ALDC DECOMPRESSORS INSIDE PRINTER ASIC

(75) Inventors: Perry P. Davenport, Longmont; Timothy D'Avis, Superior; Larry David Teklits, Loveland, all of CO (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/549,803

(22) Filed: Apr. 14, 2000

(51) Int. Cl.[7] ................................................. H03M 7/00
(52) U.S. Cl. ........................ 341/50; 358/1.2; 714/819
(58) Field of Search .................. 358/1.2, 1.15, 358/1.16; 341/50, 67, 87

(56) References Cited

U.S. PATENT DOCUMENTS

| | | | | |
|---|---|---|---|---|
| 3,980,809 | * | 9/1976 | Cook | 358/433 |
| 5,050,006 | * | 9/1991 | Ogawa | 358/440 |
| 5,247,638 | * | 9/1993 | O'Brien et al. | 341/87 |
| 5,572,209 | * | 11/1996 | Farmer et al. | 341/67 |
| 5,704,020 | * | 12/1997 | Hanyu et al. | 358/1.2 |
| 5,740,282 | * | 4/1998 | Hurd | 382/248 |
| 6,002,814 | * | 12/1999 | Chadez | 382/303 |
| 6,026,508 | * | 2/2000 | Craft | 714/819 |
| 6,121,903 | * | 9/2000 | Kalkstein | 341/63 |
| 6,130,630 | * | 10/2000 | Grohs et al. | 341/51 |

* cited by examiner

Primary Examiner—Peguy Jeanpierre
Assistant Examiner—Jean Bruner JeanGlaude
(74) Attorney, Agent, or Firm—David W. Victor; Konrad Raynes & Victor LLP

(57) ABSTRACT

A data buffering/transformation system and method that compresses a received signal and stores the compressed received data signal in a data storage unit to conserve storage usage. The system decompresses the data signal prior to transmitting the signal. The received data signal may be an encoded data signal. In such a case, the system further decompresses the received data signal, decodes the signal, recompresses the signal, and stores the signal in the data storage unit. The system and method employs a combination compressor and first decompressor and a second decompressor so the system and method can simultaneously decompress a compressed received data signal and decompress a compressed decoded received data signal.

27 Claims, 3 Drawing Sheets

DUAL ALDC DECOMPRESSORS INSIDE PRINTER ASIC

BACKGROUND OF THE INVENTION

1. Field of the Invention

This invention relates to data buffering/transformation systems, in particular to data buffering/transformation systems that utilize lossless compression and decompression algorithms or hardware to maximize limited memory resources.

2. Description of Related Art

In prior art buffering/transformation systems such as system 10 shown in FIG. 1, data is received and then buffered or stored in a data storage unit 12 prior to transmission. The received data may be buffered because it is received at a data rate greater than the data rate of the transmitted data. In addition, the received data may be data that needs to be transformed to a different format before it can be transmitted. In such embodiments, the received data may be buffered or stored in the data storage unit 12 prior to its transformation and transmission.

In either case, the data is stored or buffered temporarily in the data storage unit 12. The data storage unit 12 capacity may be determined as a function of the differential data rates (input/output rate), burst rates, and the time required to transform the received data. Due to high storage prices, the storage cost that the buffering/transformation system 10 requires can be prohibitive. In order to reduce the storage size (total effective storage capacity) and, thus the system cost, some prior art systems have added a combination compressor/decompressor ("C/D") 14.

The C/D 14 compresses received data prior to storage in the data storage unit 12. Consequently, the storage requirements for the system 10 may be reduced. The C/D 14 also decompresses data stored in the data storage unit 12 prior to transmission. Preferably, the received data is compressed using a lossless compression algorithm such as Adaptive Lossless Data Compression ("ALDC"), which is well known by those of ordinary skill in the art. See, for example, commonly assigned U.S. Pat. No. 5,572,209 "Method and apparatus for compressing and decompressing data," Farmer et al. issued Nov. 5, 1996.

In conventional systems that transform or manipulate data prior to transmitting the data, data is received, compressed, and then stored in its received or raw format in the data storage unit 12. Data in the data storage unit 12 may then be retrieved, decompressed by C/D 14, and transformed for transmission. A transmission system may be coupled to the system 10 to receive the transmitted data. Depending on the transmission system's rate or status, the transformed data may also need to be buffered prior to transmission. C/D 14 compresses the transformed data and stores the compressed transformed data in data storage unit 12. Next, C/D 14 retrieves the transformed data in data storage unit 12, decompresses the data, and transmits the decompressed data. Thus, C/D 14 is required to decompress stored, compressed, received or raw data so that the data can be transformed, compressed, and returned to memory. C/D 14 is further required to decompress stored, compressed, transformed data to be transmitted. C/D 14 may limit system 10 throughput due to the simultaneous decompression demands.

A data buffering/transformation system is needed to overcome these and other problems of the prior art.

SUMMARY OF THE INVENTION

The present invention provides a data buffering system that can decompress raw or received data while decompressing transformed data. The data buffering system includes a combination compressor and first decompressor which is coupled to a data storage unit. The system also includes a second decompressor coupled to the data storage unit. In this system, the combination compressor and first decompressor compress a received data signal for storage in the data storage unit. The second decompressor decompresses the compressed received data signal.

In one embodiment of the data buffering system, the combination compressor and first decompressor as well as the second decompressor are all lossless. Further, the received data signal may be an encoded data signal. The data buffering system is coupled to a data processing unit. The combination compressor and first decompressor decompresses the compressed received data signal stored in the data storage unit and passes the decompressed data signal to the data processing unit. The data processing unit converts the encoded data signal into a decoded received data signal. Further, the combination compressor and first decompressor compresses the decoded received data signal for storage in the data storage unit. The second decompressor then decompresses the compressed decoded received data signal stored in the data storage unit.

In a further embodiment the received data signal is an encoded print signal and the decompressed decoded data signal is a decoded print signal. The data buffering system is a data buffering/transformation system that transforms an encoded data signal into a decoded data signal.

BRIEF DESCRIPTION OF THE DRAWINGS

Like reference numbers and designations in the various drawings indicate like elements.

DETAILED DESCRIPTION OF THE PREFERRED EMBODIMENTS

Throughout this description, the preferred embodiment and examples shown should be considered as exemplars, rather than as limitations on the present invention.

Figure 1:
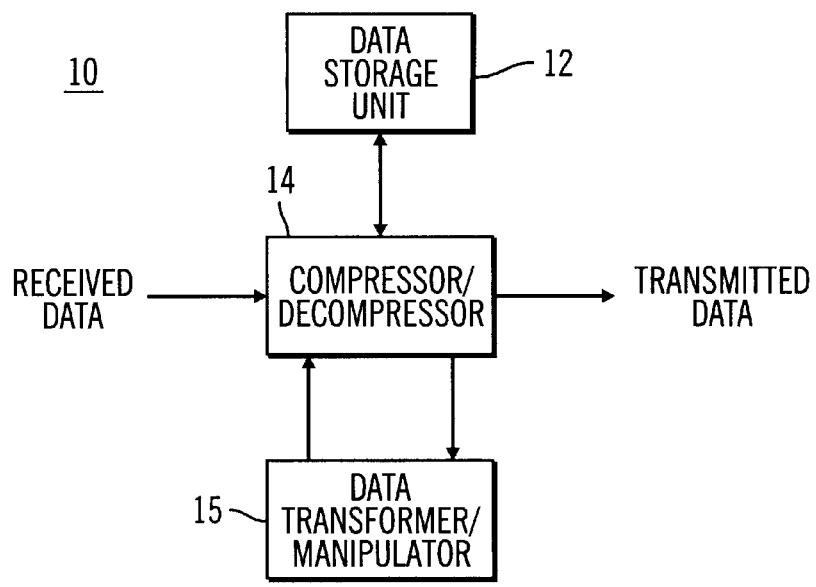
FIG. 1 is a block diagram of a prior art buffering/transformation system utilizing data compression.
Figure 2:
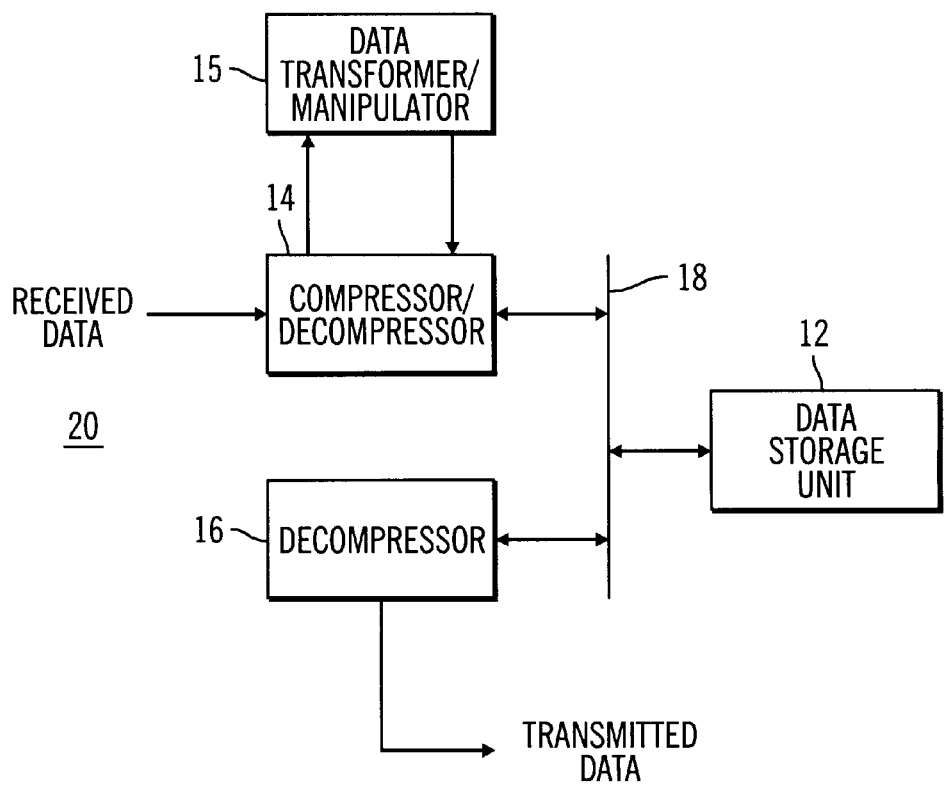
FIG. 2 is a block system of a data buffering/transformation system utilizing data compression in accordance with the present invention.

FIG. 2 illustrates a data buffering/transformation system 20 in accordance with the present invention. System 20 includes a compressor/decompressor ("C/D") 14, a decompressor 16, a data storage unit 12, a data transformer/manipulator 15, and a databus 18. C/D 14 compresses received data and stores the compressed data in data storage unit 12 via databus 18. Decompressor 16 retrieves compressed data signals from data storage unit 12 via databus 18. The decompressor 16 decompresses the retrieved data signal to generate transmit data. A system coupled to the decompressor 16 may process the transmitted data.

The C/D 14 also retrieves compressed data from data storage unit 12 via databus 18 and decompresses the data. In a preferred embodiment, the data transformer/manipulator 15 modifies the decompressed data generated by the C/D 14. The C/D 14 recompresses the modified data and stores it in data storage unit 12 via databus 18. The system 20 can 1) decompress compressed received data and 2) decompress compressed transformed or modified data simultaneously.

Figure 3:
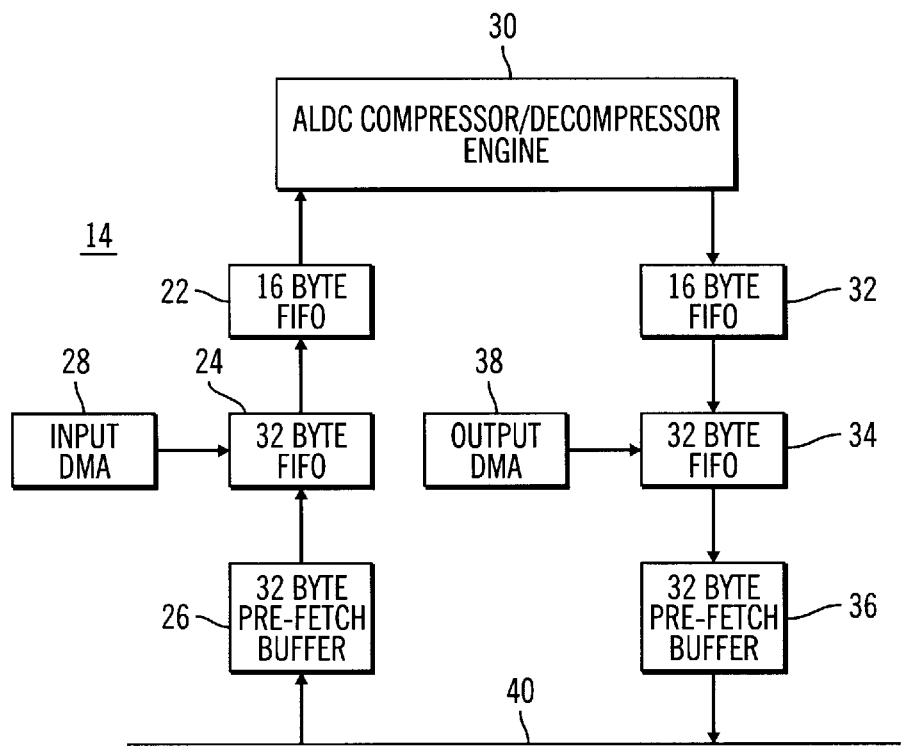
FIG. 3 is a block diagram of an ALDC compressor/decompressor according to an embodiment of the present invention.
Figure 4:
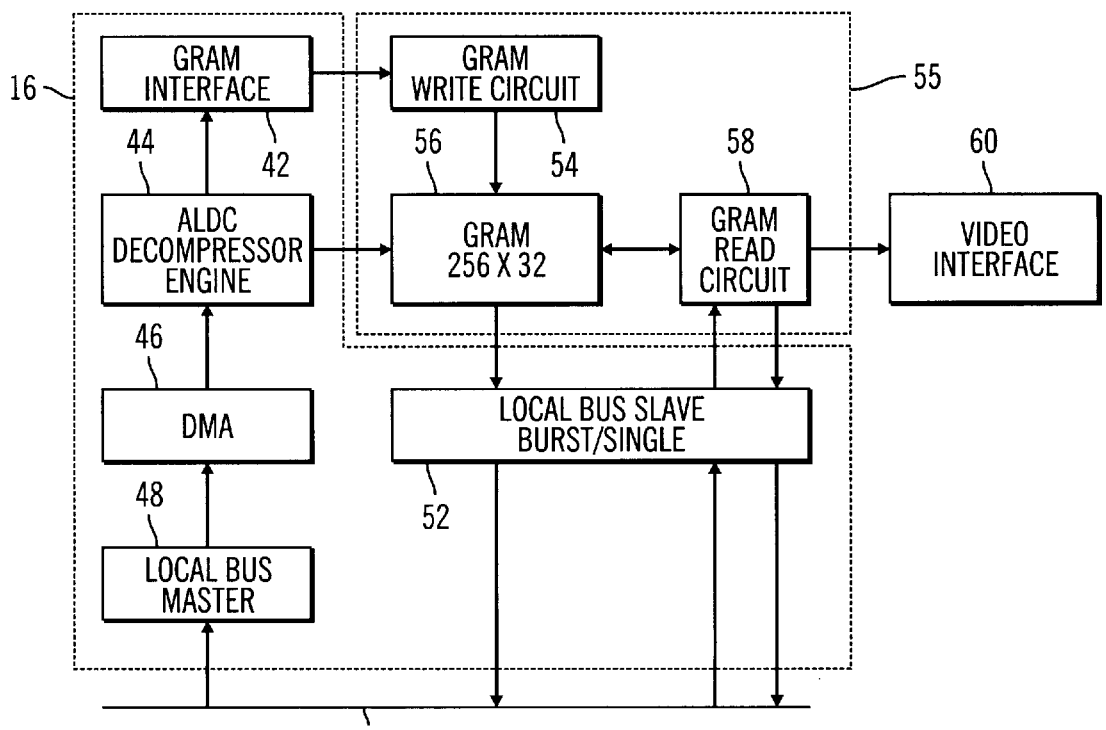
FIG. 4 is a block diagram of an ALDC decompressor coupled to a printer preprocessing system according to an embodiment of the present invention.
Figure 5:
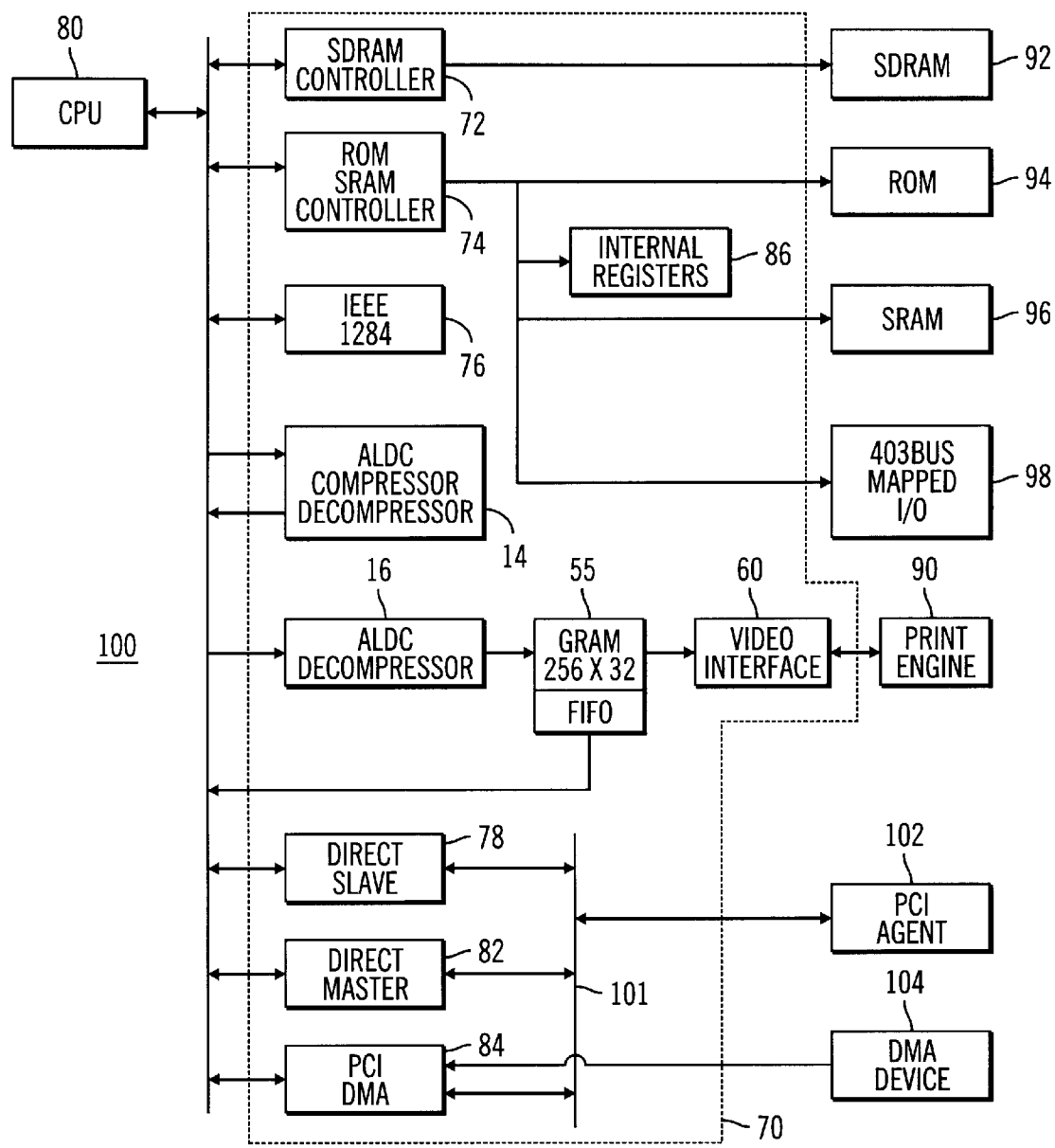
FIG. 5 is a block diagram of a printing system including a printer ASIC according to an embodiment of the present invention.

A preferred embodiment of a data buffering/transformation system is presented with reference to FIGS. 3–5. FIG. 5 is a diagram of a printing system 100. The printing system 100 includes a main central processing unit ("CPU") 80, a local bus 40, a printer application specific integrated circuit ("PASIC") 70, data storage units 92, 94, and 96, a bus mapped input/output ("I/O") controller 98, a print engine 90, a peripheral component interface ("PCI") agent 102, and a direct memory access ("DMA") device 104. The CPU 80 is a microprocessor such as a PowerPC, Intel®, AMD®, or Cyrix® microprocessor. As shown in FIG. 5, the data storage units 92, 94, and 96 include synchronous dynamic random access memory ("SDRAM") 92, read only memory ("ROM") 94 and synchronous RAM ("SRAM") 96. Any form of RAM or data storage such as magnetic or optical storage may be used in place of units 92 and 96.

PASIC 70 includes an SDRAM controller 72, a ROM/SRAM controller 74, internal registers 86, an IEEE 1284 interface 76, an ALDC compressor/decompressor 14, an ALDC decompressor 16, a graphics RAM ("GRAM") system 55, a video interface 60, a direct slave buffer 78, a direct master buffer 82, a PCI/DMA buffer 84, and an internal bus 101. The SDRAM controller 72 is coupled to the local bus 40 and SDRAM 92 and controls access to the SDRAM 92 via the local bus 40. Likewise, the ROM/SRAM controller 74 is coupled to the ROM 94 and SRAM 96 and local bus 40 and controls access to the ROM 94 and SRAM 96 via the local bus 40. The direct slave buffer 78, direct master buffer 82, and PCI DMA buffer 84 are coupled to the local bus 40 and internal bus 101. The internal bus 101 is also coupled to the PCI agent 102 and DMA device 104. The buffers 78, 82, and 84, PCI agent 102, and DMA device 104 are used to place data on the local bus 40 for routing to the SDRAM controller 72, ROM/SRAM controller 74, ALDC compressor/decompressor ("C/D") 14, and ALDC decompressor 16.

ALDC C/D 14 receives uncompressed and compressed data on local bus 40. The C/D 14 compresses the uncompressed data, decompresses the compressed data, and returns the processed data to the local bus 40. The compressed data may be stored in a memory unit 92 or 96. In the PASIC 70, the data may be printer data where the data is encoded in a printer encoding language such as Postscript, printer control language ("PCL"), intelligent printer data stream ("IPDS"), or other printer language. The C/D 14 may also decompress encoded data where the encoded data may be stored in the memory units 92 and 96. In order to build a page or a page segment to be printed via the print engine 90, the encoded data may need to be decoded (transformed) from a printer language to a different form capable of use by the print engine 90 (and video interface 60 in this preferred embodiment.)

CPU 80 transforms the decompressed encoded printer data into a usable format (such as bit-mapped image data). In order to conserve memory resources, C/D 14 may compress the decoded printer data and store the compressed data in a memory unit 92 or 96 for printing at a later point. The ALDC decompressor 16 receives compressed decoded printer data from the local bus 40, decompresses the decoded printer data, and stores the decompressed decoded data in the GRAM 55. Thus, the C/D 14 may decompress encoded printer data to be decoded or transformed while decompressor 16 decompresses decoded compressed printer data. The video interface 60 retrieves decompressed, decoded printer data from the GRAM 55 and converts the data into a print engine 90 usable format.

The print engine 90 receives the formatted printer data from the video interface 60 and generates a formatted printer data hard copy. The print engine 90 may be any printer engine type including Light Amplification by Stimulated Emission of Radiation ("LASER"), Light-Emitting Diode ("LED"), dot matrix or ink-jet based print engines. Accordingly, PASIC 70 may be used to efficiently process printer data while conserving memory usage by losslessly compressing or decompressing printer data.

FIG. 3 illustrates an ALDC compressor/decompressor 14. The ALDC C/D 14 includes an ALDC compressor/decompressor engine 30, a 32-byte pre-fetch input buffer 26, a 32-byte input first in first out ("FIFO") 24, an input DMA 28, a 16-byte input FIFO 22, a 32-byte pre-fetch output buffer 36, a 32-byte output FIFO 34, an output DMA 38, and a 16-byte output FIFO 32. The 32-byte input pre-fetch buffer 26 and 32-byte pre-fetch output buffer 36 are coupled to the local bus 40. The 32-byte pre-fetch buffer 26 receives compressed data and uncompressed data where the data is to be decompressed and compressed by the ALDC C/D engine 30. The 32-byte input FIFO 24, input DMA 28, and 16-byte FIFO 22 are used in combination to convert 32-byte data words stored in the 32-byte pre-fetch buffer 26 into 16-byte data words for processing by ALDC C/D engine 30.

Likewise, the 16-byte output FIFO 32, 32-byte output FIFO 34, and output DMA 38 are used to convert 16-byte data words generated by ALDC C/D engine 30 into 32-byte data words. The 32-byte pre-fetch output buffer 36 buffers the 32-byte data words generated by 32-byte input FIFO 34 for transmission over local bus 42 to a memory unit 92 and 96. An ALDC decompressor 16 and GRAM system 55 preferred embodiment for use in the PASIC are shown in FIG. 4.

As shown in FIG. 4, ALDC decompressor 16 includes a local bus master interface 48, a DMA controller 46, an ALDC decompressor engine 44, a GRAM interface 42, and a local bus slave 52. The GRAM system 55 includes a GRAM write circuit 54, a GRAM memory 56, and a GRAM read circuit 58. The local bus master interface 48 is coupled to the local bus 40 and ALDC decompressor engine 44 via the DMA controller 46. The GRAM interface 42 of the decompressor 16 is coupled to the ALDC decompressor engine 44 and GRAM system 55 via the GRAM write circuit 54. The local bus master interface 48 and DMA controller 46 retrieve data words from the local bus 40 and provide the data words to the ALDC decompressor engine 44 where the data words represent compressed data. The ALDC decompressor engine 44 decompresses the data words retrieved from the local bus 40 via the local bus master interface 48 and the DMA controller 46.

The GRAM interface 42 and the GRAM write circuit 54 store the decompressed data words in the GRAM memory 56. The GRAM write circuit 54 is coupled to the GRAM memory 56 and GRAM interface 42. The GRAM read circuit 58 passes the decompressed data words stored in the GRAM memory 56 to the video interface 60 for further processing. The local bus slave 52 may transmit decompressed data words stored in the GRAM memory 56 to the local bus 40.

The preferred embodiment shown in FIG. 5 is incorporated in a printer ASIC 70. The preferred embodiment may be incorporated in many different types of ASICs including for example a screen display ASIC. Accordingly, it is to be understood that the invention is not to be limited by the specific illustrated embodiment, but only by the scope of the appended claims.

While this invention has been described in terms of a best mode for achieving this invention's objectives, it will be appreciated by those skilled in the art that variations may be accomplished in view of these teachings without deviating from the spirit or scope of the present invention. For example, the present invention may be implemented using any computer programming software, firmware or hardware combination. As a preparatory step to practicing the invention or constructing an apparatus according to the invention, the computer programming code (whether software or firmware) according to the invention will typically be stored in one or more machine readable storage mediums such as fixed (hard) drives, diskettes, optical disks, magnetic tape, semiconductor memories such as ROMs, PROMs, etc., thereby making an article of manufacture in accordance with the invention. The article of manufacture containing the computer programming code is used by either executing the code directly from the storage device, by copying the code from the storage device into another storage device such as a hard disk, RAM, etc., or by transmitting the code on a network for remote execution.

What is claimed is:

1. A data buffering system, coupled to a data storage unit, comprising:
    a) a combination compressor and first decompressor coupled to the data storage unit; and
    b) a second decompressor coupled to the data storage unit,
    c) wherein the combination compressor and first decompressor compress a received data signal for storage in the data storage unit and the second decompressor decompresses the compressed data signal stored in the data storage unit to generate a transmit data signal.

2. The data buffering system of claim 1, wherein the combination compressor and first decompressor is a lossless compressor and decompressor and the second decompressor is a lossless decompressor.

3. The data buffering system of claim 2, wherein the received data signal is an encoded data signal.

4. The data buffering system of claim 3, wherein the data buffering system is coupled to a data processing unit, the combination compressor and first decompressor decompresses the compressed received data signal stored in the least one data storage unit and passes the decompressed first data signal to the data processing unit, and the data processing unit converts the encoded received data signal into a decoded received data signal.

5. The data buffering system of claim 4, wherein the combination compressor and first decompressor compresses the decoded received data signal for storage in the data storage unit and the second decompressor decompresses the compressed decoded received data signal stored in the data storage unit to generate the transmit data signal.

6. The data buffering system of claim 5, wherein the received data signal is an encoded print signal and the transmit data signal is a decoded print signal.

7. The data buffering system of claim 6, wherein the data buffering system is a data buffering/transformation system that transforms the received data signal into the transmit data signal.

8. The data buffering system of claim 6, wherein the data buffering system is an application specific integrated circuit.

9. The data buffering system of claim 6, wherein the data buffering system is a printer application specific integrated circuit.

10. The data buffering system of claim 1, wherein the combination compressor and first decompressor are capable of decompressing one compressed received data signal in the data storage unit while the second decompressor is decompressing another compressed data signal stored in the data storage unit.

11. A data signal buffering method, the method comprising the steps of:
    a) receiving a data signal;
    b) compressing the received data signal using a combination compressor and first decompressor;
    c) storing the compressed received data signal in a data storage unit;
    d) retrieving the compressed received data signal from the data storage unit; and
    e) decompressing the retrieved compressed received data signal using a second decompressor.

12. The buffering method of claim 11, wherein the first data signal is an encoded data signal.

13. The data buffering method of claim 12, further comprising the steps of:
    f) retrieving the compressed received data signal from the data storage unit;
    g) decompressing the retrieved compressed received data signal using the combination compressor and first decompressor; and
    h) decoding the retrieved decompressed received data signal.

14. The data buffering method of claim 13, further comprising the steps of:
    i) compressing the decoded received data signal using the combination compressor and first decompressor;
    j) storing the compressed decoded received data signal in the data storage unit;
    k) retrieving the compressed decoded received data signal from the data storage unit; and
    l) decompressing the retrieved decoded compressed received data signal using a second decompressor.

15. The data buffering method of claim 14, wherein the received data signal is an encoded print signal and the decompressed decoded data signal is a decoded print signal.

16. The data buffering method of claim 15, wherein the data buffering method is a data buffering/transformation method that transforms data signals.

17. The data buffering method of claim 13, wherein step a) includes compressing the received data signal using a lossless compression algorithm and step e) includes decompressing the compressed received data signal using the same lossless compression algorithm.

18. The data buffering method of claim 11, further comprising:
    decompressing, with the combination compressor and first decompressor, one compressed received data signal in the data storage unit while decompressing, with the second decompressor, another compressed data signal stored in the data storage unit.

19. The data buffering method of claim 11, wherein step b) includes compressing the received data signal using a lossless compression algorithm and step e) includes decompressing the compressed received data signal using the same lossless compression algorithm.

20. An article of manufacture, the article of manufacture comprising computer readable storage media including program logic embedded therein that causes control circuitry to perform the steps of:

a) compressing a received data signal using a combination compressor and first decompressor;

b) storing the compressed received data signal in a data storage unit;

c) retrieving the compressed received data signal from the data storage unit; and d) decompressing the retrieved compressed received data signal using a second decompressor.

21. The article of manufacture of claim 20, wherein step a) includes compressing the received data signal using a lossless compression algorithm and step d) includes decompressing the compressed received data signal using the same lossless compression algorithm.

22. The article of manufacture of claim 20, further comprising:

decompressing, with the combination compressor and first decompressor, one compressed received data signal in the data storage unit while decompressing, with the second decompressor, another compressed data signal stored in the data storage unit.

23. The article of manufacture of claim 20, wherein the received data signal is an encoded data signal.

24. The article of manufacture of claim 23, further comprising the steps of:

e) retrieving the compressed received data signal from the data storage unit;

f) decompressing the retrieved compressed received data signal using the combination compressor and first decompressor; and g) decoding the retrieved decompressed received data signal.

25. The article of manufacture of claim 24, further comprising the steps of:

h) compressing the decoded received data signal using the combination compressor and first decompressor;

i) storing the compressed decoded received data signal in the data storage unit;

j) retrieving the compressed decoded received data signal from the data storage unit; and k) decompressing the retrieved decoded compressed received data signal using a second decompressor.

26. The article of manufacture of claim 25, wherein the received data signal is an encoded print signal and the decompressed decoded data signal is a decoded print signal.

27. The article of manufacture of claim 24, wherein step a) includes compressing the received data signal using a lossless compression algorithm and step d) decompresses the compressed received data signal using the same lossless compression algorithm.

* * * * *